(12) United States Patent
Hong et al.

(10) Patent No.: US 8,709,834 B2
(45) Date of Patent: Apr. 29, 2014

(54) METHODS OF FABRICATING SEMICONDUCTOR DEVICE

(75) Inventors: Sang-Hyun Hong, Seoul (KR);
Jung-Hyuk Lee, Hwaseong-si (KR);
Su-Jin Ahn, Hwaseong-si (KR);
Dae-Won Ha, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/411,678

(22) Filed: Mar. 5, 2012

(65) Prior Publication Data

US 2012/0225504 A1    Sep. 6, 2012

(30) Foreign Application Priority Data

Mar. 3, 2011    (KR) .......................... 10-2011-0019098

(51) Int. Cl.
*H01L 21/66*    (2006.01)
*G01R 31/26*    (2006.01)

(52) U.S. Cl.
USPC .................. 438/17; 438/95; 438/102; 257/1; 257/5; 257/E45.002; 257/E45.003; 257/E21.529; 257/E21.531; 324/750.05; 324/750.01; 324/762.01

(58) Field of Classification Search
USPC .............. 438/17, 95, 102; 257/1, 5, E45.002, 257/E45.003, E21.521, E21.529, E21.531; 324/537, 750.01, 750.03, 750.05, 324/762.01
See application file for complete search history.

(56) References Cited

U.S. PATENT DOCUMENTS

| | | | |
|---|---|---|---|
| 4,978,712 A * | 12/1990 | Bair et al. ...................... 525/51 |
| 5,930,598 A * | 7/1999 | Wille et al. ................... 438/108 |
| 6,249,052 B1 * | 6/2001 | Lin .............................. 257/737 |
| 7,279,223 B2 * | 10/2007 | Rubinsztajn et al. ......... 428/414 |
| 7,371,618 B2 * | 5/2008 | Yoon ............................. 438/127 |
| 7,499,315 B2 * | 3/2009 | Lowrey et al. ................ 365/163 |
| 7,575,950 B2 * | 8/2009 | Shiba ............................. 438/95 |
| 7,619,936 B2 | 11/2009 | Philipp et al. |
| 7,718,990 B2 * | 5/2010 | Sandoval .......................... 257/2 |
| 7,839,674 B2 * | 11/2010 | Lowrey et al. ................ 365/163 |
| 7,888,165 B2 * | 2/2011 | Hampton ......................... 438/95 |
| 7,967,994 B2 * | 6/2011 | Lowrey et al. .................. 216/58 |
| 7,977,674 B2 * | 7/2011 | Yoon et al. ...................... 257/42 |
| 8,344,475 B2 * | 1/2013 | Shaeffer et al. ............... 257/528 |
| 8,476,770 B2 * | 7/2013 | Shao et al. .................... 257/774 |
| 2004/0102529 A1 * | 5/2004 | Campbell et al. .............. 516/79 |
| 2005/0048693 A1 * | 3/2005 | Yoon ............................ 438/106 |
| 2006/0105556 A1 | 5/2006 | Matsui et al. |
| 2007/0034851 A1 * | 2/2007 | Kostylev et al. ................. 257/4 |
| 2007/0286947 A1 | 12/2007 | Horii |

(Continued)

FOREIGN PATENT DOCUMENTS

| JP | 2006-202823 | 8/2006 |
|---|---|---|
| KR | 1020060012182 A | 2/2006 |

(Continued)

*Primary Examiner* — Mary Wilczewski
(74) *Attorney, Agent, or Firm* — Volentine & Whitt, PLLC

(57) ABSTRACT

A method of manufacturing a semiconductor device includes providing a wafer, forming a memory device which includes phase change material layer on the wafer, completing a wafer level process of manufacturing the semiconductor device, and performing a thermal treatment process on the wafer to densify the phase change material. To this end, the process temperature of the thermal treatment is higher than the crystallization temperature of the phase change material and lower than the melting point of the phase change material.

17 Claims, 18 Drawing Sheets

(56) References Cited

U.S. PATENT DOCUMENTS

| | | | |
|---|---|---|---|
| 2008/0157219 A1* | 7/2008 | Fujiwara et al. | 257/383 |
| 2008/0187613 A1* | 8/2008 | Yoon | 425/89 |
| 2008/0194106 A1* | 8/2008 | Oh et al. | 438/685 |
| 2009/0029031 A1* | 1/2009 | Lowrey | 427/58 |
| 2009/0140229 A1* | 6/2009 | Sandoval | 257/3 |
| 2009/0226603 A1* | 9/2009 | Lowrey | 427/58 |
| 2010/0029062 A1* | 2/2010 | Lung | 438/466 |
| 2012/0058637 A1* | 3/2012 | Hirota | 438/624 |
| 2012/0225504 A1* | 9/2012 | Hong et al. | 438/17 |
| 2012/0248595 A1* | 10/2012 | Or-Bach et al. | 257/706 |
| 2012/0309159 A1* | 12/2012 | Chen et al. | 438/381 |
| 2013/0001499 A1* | 1/2013 | Breitwisch et al. | 257/3 |

FOREIGN PATENT DOCUMENTS

| | | | | |
|---|---|---|---|---|
| KR | 2009116344 | * | 11/2009 | H01L 21/8247 |
| KR | 1020100028199 A | | 3/2010 | |
| WO | WO 2007/037796 | * | 4/2007 | C23C 14/06 |

* cited by examiner

METHODS OF FABRICATING SEMICONDUCTOR DEVICE

PRIORITY STATEMENT

This application claims the benefit of Korean Patent Application No. 10-2011-0019098, filed on Mar. 3, 2011, in the Korean Intellectual Property Office, the disclosure of which is incorporated herein in its entirety by reference.

BACKGROUND

The inventive concept relates to a method of manufacturing a semiconductor device. More particularly, the inventive concept relates to a method of manufacturing a non-volatile memory semiconductor device including phase change material.

Non-volatile semiconductor memory devices are used in a variety of electronic products for their ability to retain stored data even when the power supplied to the product is turned off. One recently developed type of non-volatile semiconductor memory device is a phase change memory device that has memory material whose phase or "state" can be changed, e.g., between amorphous and crystalline states. The state of the memory material can be equated with a logic state of the device or otherwise corresponds to the data stored by the device. That is, the state of the memory material can be read as a value of data stored by the device and the state of the device can be changed to program or write data onto the device.

The demands of today's electronic products require that their non-volatile semiconductor memory devices operate at high speeds, be highly integrated, and have long lifespans. Accordingly, non-volatile phase change memory devices must include phase change material that can quickly and repeatedly change its state over many cycles, i.e., over a high number of write operations.

SUMMARY

According to an aspect of the inventive concept, there is provided a method of manufacturing a semiconductor device, the method including: forming a memory device of phase change material on a wafer, completing a wafer level process of manufacturing the semiconductor device, and densifying the phase change material by subjecting the wafer to a thermal treatment.

According to another aspect of the inventive concept, there is provided a method of manufacturing a semiconductor device, the method including: providing a wafer, forming a memory device of phase change material on a wafer, completing a wafer level process of manufacturing the semiconductor device, subsequently performing a burn-in test on the memory device, and subsequently densifying the phase change material by subjecting the wafer to a thermal treatment process conducted at a temperature higher than the crystallization temperature of the phase change material and lower than the melting point of the phase change material.

According to still another aspect of the inventive concept, there is provided a method of manufacturing a semiconductor device, the method including: forming a memory array of cells on a wafer, wherein each cell includes a memory device comprising phase change material, completing a wafer level process of manufacturing the semiconductor device, and densifying the phase change material after the fab-out has taken place.

BRIEF DESCRIPTION OF THE DRAWINGS

The inventive concept will be more clearly understood from the following detailed description of the preferred embodiments thereof taken in conjunction with the accompanying drawings in which.

DETAILED DESCRIPTION OF THE PREFERRED

Various embodiments and examples of embodiments of the inventive concept will be described more fully hereinafter with reference to the accompanying drawings. Note, like numerals are used to designate like elements throughout the drawings.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Figure 1:
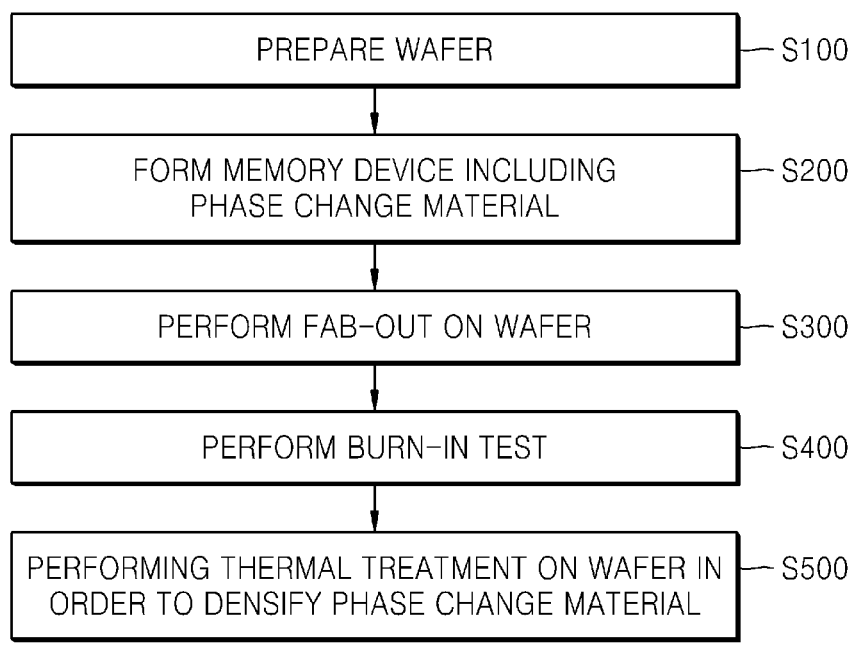
FIG. 1 is a flowchart of a method of manufacturing a semiconductor device, according to the inventive concept.

A method of manufacturing a semiconductor device, according to the inventive concept, will now be generally described with reference to the flowchart of FIG. 1.

First, a substrate is provided by preparing a wafer (S100), for example. Then a memory device including a layer of phase change material is formed on the wafer (S200). Next, a fab-out operation is preformed (S300). Then, the wafer is thermally treated to densify the (layer of) phase change material (S500). Furthermore, a first burn-in test (S400) may be performed on the memory device between the fab-out operation (S300) and the thermal treatment (S500). In this regard, the wafer may be thermally treated (S500) to densify the (layer of) phase change material after the fab-out operation (S300) is performed on the wafer and/or after the first burn-in test (S400) is performed on the memory device.

The above-mentioned operations will now be described in more detail.

The substrate provided (S100) comprises semiconductor material such as silicon (Si), silicon-germanium (SiGe), and/or silicon carbide (SiC). In this respect, the substrate may be a silicon-on-insulator (SOI) or a semiconductor-on-insulator (SEOI) substrate. Also, the substrate may comprise a 200 mm (8 inch) or 300 mm (12 inch) diameter wafer. Furthermore, a dielectric layer of silicon oxide, titanium oxide, aluminum oxide, zirconium oxide, or hafnium oxide, and a conductive layer of titanium (Ti), titanium nitride (TiN), aluminum (Al), tantalum (Ta), tantalum nitride (TaN), and/or titanium aluminum nitride (TiAlN) may be formed on the semiconductor material, i.e., on the wafer. Also, the substrate may include an epitaxial layer.

Figure 2:
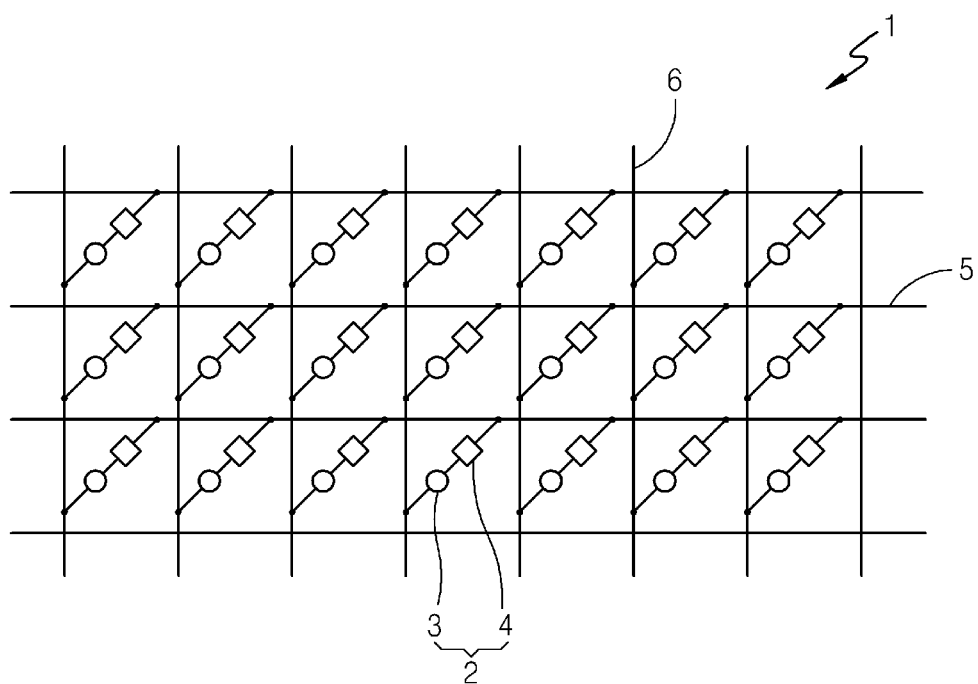
FIG. 2 is a schematic diagram of an example of an array of memory devices fabricated according to the inventive concept.

An example of a memory device, including phase change material, formed on the substrate (S200) will be described in detail with reference to FIGS. 3-5. First, however, a typical array 1 of the memory devices, which may be fabricated in process (S200), will be described with reference to FIG. 2.

The memory device array 1 includes a plurality of unit cells 2 arranged in a matrix, and first address lines 5 and second address lines 6. Each cell 2 has a memory portion 3 and an access portion 4, and is electrically connected to a first address line 5 and a second address line 6. The first address lines 5 cross the second address lines 6 so that the first and second address lines 5 and 6 subtend predetermined angles. For example, the first address lines 5 may be perpendicular to the second address lines 6. The first address lines 5 or the second address lines 6 are electrically connected to (and hence, may be considered as) bit lines, and the other of the first address lines 5 and the second address lines 6 are electrically connected to (and hence, may be considered as) word lines.

The memory portion 3 may include a phase-change material, a ferroelectric material, or a magnetic material. Thus, a state of the memory portion 3 is based on the amount of current supplied thereto, and can be changed by changing the amount of the current supplied.

The access portion 4 regulates the current supplied to the memory portion 3 based on the voltage of the word line. The access portion 4 may be a diode, a bipolar transistor, or a metal oxide semiconductor (MOS) transistor.

A phase-change random access memory (PRAM) device 100, constituting a unit cell 2 of the array, will now be described with reference to FIGS. 3-5.

Figure 3:
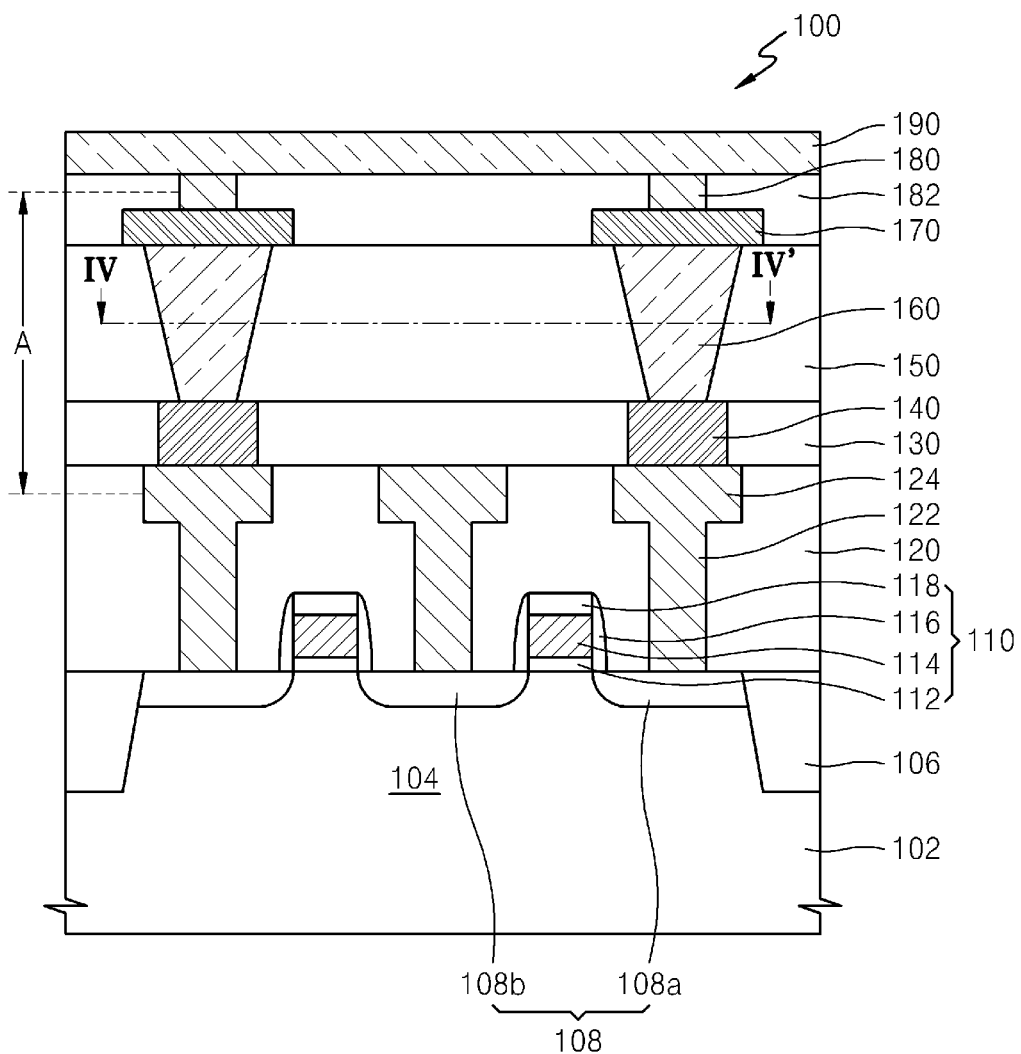
FIG. 3 is a cross-sectional view of a semiconductor device that can be fabricated according to the inventive concept.

Referring first to FIG. 3, the memory device 100 includes a gate structure 110, a lower electrode 140, a phase change material layer 160, and an upper electrode 170 that are formed on a substrate 102, e.g., on a processed wafer. In this example of a phase change memory device, the lower electrode 140, the phase change material layer 160, and the upper electrode 170 together constitute the memory portion 3 of a unit cell 2.

Furthermore, the memory device 100 includes a device isolation layer 106 formed in the substrate 102 to define an active region 104 of the substrate 102. The gate structure 110 is disposed on the active region 104. The device isolation layer 106 may be formed using a conventional shallow trench isolation (STI) method. Also, a word line, a bit line, or other semiconductor devices (not shown in FIG. 3) may also be formed in or at the upper portion of the substrate 102.

In the illustrated example, the active region 104 includes an impurity region 108 comprising a source region 108a and a drain region 108b. Each source region 108a and drain region 108b may itself include a low concentration impurity region formed proximate the gate structure 110 and a high concentration impurity region formed remotely from the gate structure 110.

The gate structure 110 includes a gate insulating layer 112, a gate electrode layer 114, a spacer 116, and a capping layer 118. In this example, the gate structure 110 and adjacent source region 108a and the drain region 108b constitute a MOS transistor serving as an access device, i.e., serving as the access portion 4 of a unit cell 2 in the array 1 shown in FIG. 2. However, a diode or a bipolar transistor, serving as an access device, may be formed at the active region 104 instead of a MOS transistor.

A first interlayer insulating layer 120 is formed on the substrate 102 so as to cover the gate structure 110. The first interlayer insulating layer 120 may comprise an oxide, nitride, or oxynitride layer. For example, the first interlayer insulating layer 120 may include at least one material selected from the group consisting of silicon oxide, silicon nitride, and silicon oxynitride. First contact plugs 122 are formed through the first interlayer insulating layer 120 into contact with the impurity region 108. More specifically, a first one of the first contact plugs 122 is formed in contact with the source region 108a of the MOS transistor, and a second one of the first contact plugs 122 is formed in contact with the drain region 108b of the MOS transistor. Also, as illustrated in FIG. 3, the first contact plugs 122 may have an extended (broader) top portion 124. Thus, the extended portion 124 of the first one of the first contact plugs 122 provides greater electrical contact with the lower electrode 140.

Furthermore, each first contact plug 122 may comprise at least one material selected from the group consisting of Ti, TiN, tungsten (W), and tungsten nitride (WN).

A second interlayer insulating layer 130 is formed on the first interlayer insulating layer 120. The second interlayer insulating layer 130 may comprise an oxide, nitride, or oxynitride. Fr example, the second interlayer insulating layer 130 may include at least one material selected from the group consisting of silicon oxide, silicon nitride, and silicon oxynitride.

The lower electrode 140 is formed on a first contact plug 122 so as to be electrically connected to the first contact plug 122 and extends through the second interlayer insulating layer 130. Accordingly, the lower electrode 140 is electrically connected to the gate structure 110 via a first contact plug 122 and the source region 108a.

In this respect, the lower electrode 140 may be formed by a conventional etching method, a damascene method, or a dual damascene method. The lower electrode 140 may comprise at least one material selected from the group consisting of metals including aluminum (Al), copper (Cu), W, Ti, and Ta, metal alloys including titanium tungsten (TiW) and titanium aluminum (TiAl), and carbon (C). For example, the lower electrode 140 may be formed of carbon nitride (CN), TiN, titanium aluminum nitride (TiAlN), TaN, WN, molybdenum nitride (MoN), niobium nitride (NbN), titanium silicon nitride (TiSiN), titanium boron nitride (TiBN), zirconium silicon nitride (ZrSiN), cobalt silicon (CoSi), tungsten silicon (WSi), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), or tantalum carbonitride (TaCN).

Also, the lower electrode 140 may have the form of a line. Alternatively, the lower electrode 140 may be annular in which case its inner space may be filled with an insulating material, or may be circular or may have an outline that is otherwise in the shape of a polygon. Furthermore, plurality of lower electrodes 140 are formed in the array 1 of FIG. 2, in which case the lower electrodes 140 may be formed as an array of conductive polyhedral elements.

A third interlayer insulating layer 150 is formed on the second interlayer insulating layer 130. The third interlayer insulating layer 150 may be formed of an oxide, nitride, or oxynitride. For example, the third interlayer insulating layer 150 may be formed of at least one material selected from the group consisting of silicon oxide, silicon nitride, and silicon oxynitride. Also, the third interlayer insulating layer 150 may be formed of the same material as the second interlayer insulating layer 130. Alternatively, the third interlayer insulating layer 150 and the second interlayer insulating layer 130 may be formed of materials having an etching selectivity with respect to each other.

A (layer or bodies of) phase change material 160 is formed in the third interlayer insulating layer 150. For example, the phase change material 160 may be formed by forming openings extending through the third insulating layer 150 and exposing the lower electrodes 140, respectively, and then filling the openings by sputtering. In this case, the phase change material layer 160 may be formed by sputtering using helium, neon, or argon ions. In another example of this process, a seed layer (not shown) is selectively formed on the lower electrodes 140, to facilitate the formation of the phase change material 160.

In any case, the phase change material 160 is formed on each lower electrode 140 as electrically connected thereto. As mentioned above, the crystal state of the phase change material 160 can be changed, in this case by changing the amount of current supplied to a lower electrode 140. Also, the surface area of the bottom of (each body of) the phase change material 160 may be equal to, smaller (as shown in the figure) or larger than the surface area of the top portion thereof.

Figure 4:
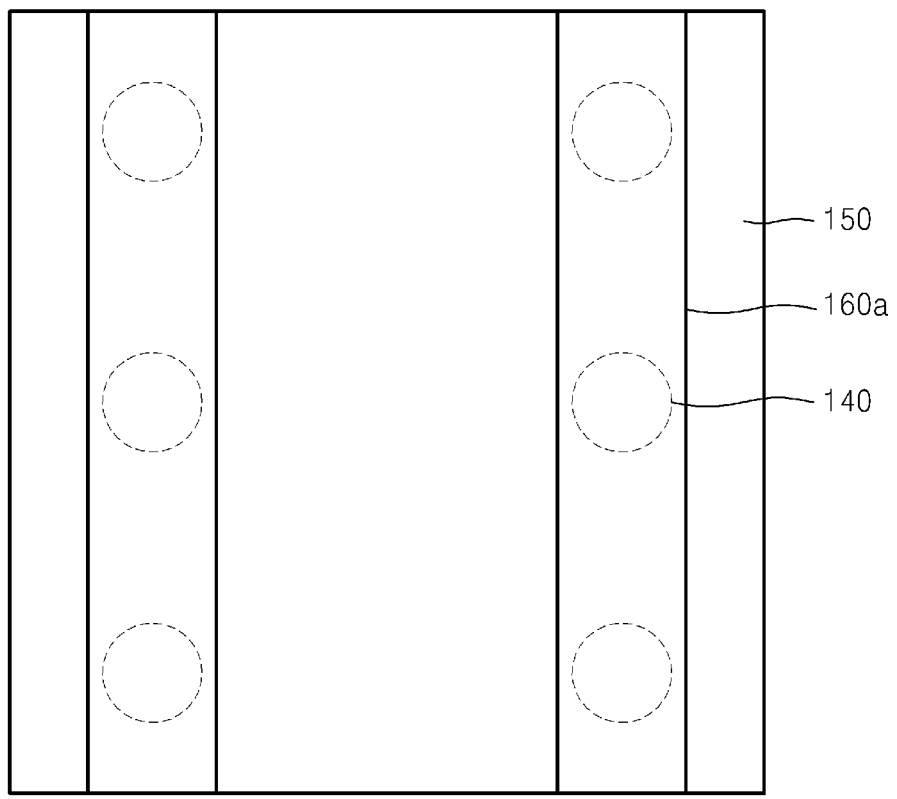
FIG. 4 is a sectional view taken along line IV-IV' of FIG. 3, showing one example of the configuration of phase change material in the device of FIG. 3.
Figure 5:
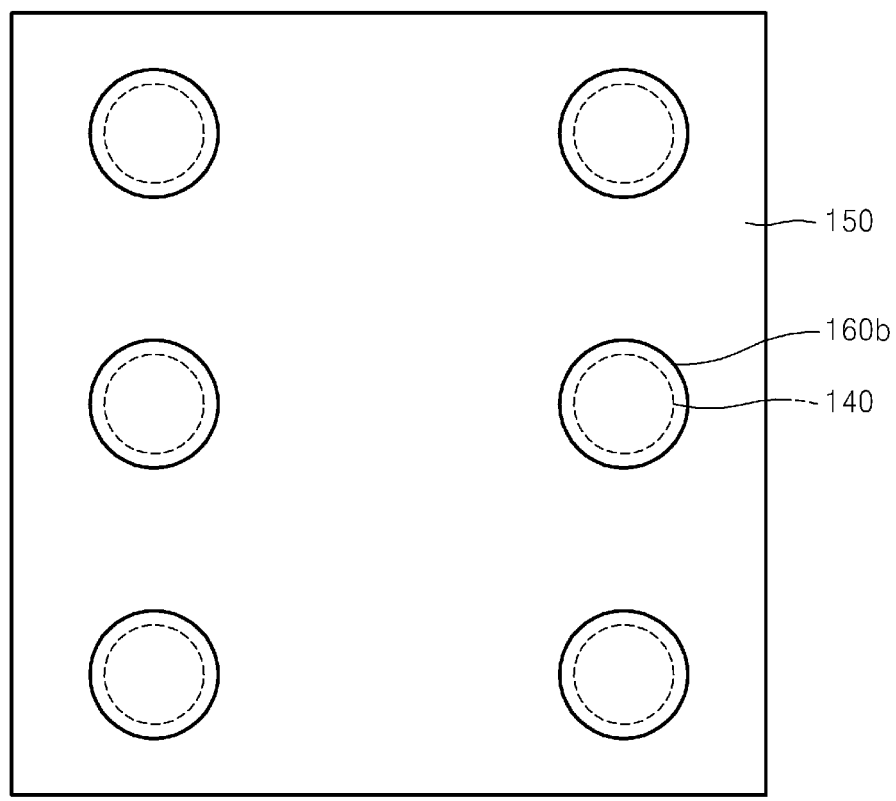
FIG. 5 is a view similar to that of FIG. 4 but showing another example of a the configuration of phase change material.

Examples of the form of the of the phase change material 160 are shown in FIGS. 4 and 5, respectively. The contact between the phase change material 160 and a plurality of the lower electrodes 140 will be described in detail with reference to these examples.

Referring to FIG. 4, the phase change material is in the form of a line pattern, i.e., is in the form of line-shaped elements 160a extending longitudinally in a given direction. Several of the lower electrodes 140 that are spaced from one another are entirely disposed below each line-shaped element 160a of phase change material. In the illustrated example, the lower electrodes 140 each have a circular outline but they may alternatively have a polygonal outline. The width of the line-shaped element 160a of phase change material may be greater than the diameter or width of each of the underlying lower electrodes 140.

Referring to FIG. 5, the phase change material comprises a plurality of elements 160b of phase change material spaced from one another. In the illustrated example, the elements of phase change material have a circular outline but they may have a polygonal outline instead. In any case, the lower electrodes 140 are disposed below the elements 160b of phase change material, respectively. The diameter or width of each line-shaped element 160a of phase change material may be greater than that of the underlying lower electrode 140.

Referring back to FIG. 3, the phase change material 160 is formed of a chalcogenide material, for example. More specifically, the phase change elements may be formed of at least one material selected from the group consisting of Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, In—Ge—Sb—Te, Sb—Se, and Ag—In—Sb—Te. Also, the phase change material 160 may also include a metal. Also, the phase change material may include at least one dopant selected from the group consisting of carbon (C), nitrogen (N), silicon (Si), oxygen (O), bismuth (Bi), tin (Sn), and boron (B), to in effect decrease the current necessary to drive the memory device 100.

Next, upper electrodes 170 are formed on the phase change material 160 as electrically connected to the phase change material 160. The upper electrodes 170 may be formed of any of the materials listed above for use in forming the lower electrodes 140. However, the lower electrodes 140 and the upper electrodes 170 may be formed of the same or different materials.

Second contact plugs 180 are formed on the upper electrodes 170 as electrically connected to the upper electrodes 170. The second contact plugs 180 may be formed of any of the materials listed above for use in forming the first contact plugs 122. However, the first contact plugs 122 and the second contact plugs 180 may also be formed of the same or different materials.

The upper electrodes 170 and the second contact plugs 180 may be surrounded by a third interlayer insulating layer 182. The third interlayer insulating layer 182 may be formed of an oxide, nitride, or oxynitride. For example, the third interlayer insulating layer 182 may be formed of at least one material selected from the group consisting of silicon oxide, silicon nitride, and silicon oxynitride. Also, an upper wiring 190 may be formed on the second contact plugs 180 as electrically connected to the second contact plugs 180. Although not shown in the drawing, an additional interlayer insulating layer and wiring patterns may additionally be formed on the upper wiring 190, and a passivation layer may be formed on such wiring patterns.

The material constituting the above-described layers and elements, that is, the first interlayer insulating layer 120, the first contact plugs 122, the second interlayer insulating layer 130, the lower electrodes 140, the third interlayer insulating layer 150, the upper electrodes 170, the second contact plugs 180, and the upper wiring 190 may be formed on the wafer by appropriate deposition processes known in the art per se, such as sputtering, chemical vapor deposition (CVD), plasma enhanced CVD (PECVD), and atomic layer deposition (ALD). These processes may be followed by planarization, or photolithography and etching processes such as chemical mechanical polishing (CMP), or dry etching processes.

The fab-out operation (S300) and the first burn-in test (S400) will now be described in more detail.

A process of completing an operation of manufacturing a semiconductor device at a wafer level is performed in a fab that is a limited space in which the size and number of foreign particles in equipment and in internal air are severely controlled with a constant temperature and moisture. In other words, a bare wafer is introduced into the fab that is the limited space, semiconductor devices are formed on the wafer, a wire is formed, a passivation layer is formed, cleansing and/or rewiring is performed, the wafer is removed from the fab that is the limited space to undergo a variety of tests, and then the wafer is packaged, which is referred to as fab-out. Hereinafter, the process of completing the operation of manufacturing the semiconductor device at the wafer level is referred to as fab-out.

In this case in which a memory device is formed on the wafer, the fab-out of the wafer is followed by a burn-in test that checks whether the memory device formed in the fab is operating normally. To better understand the burn-in test as pertains to the inventive concept, the operation of a PRAM will be described below with reference to FIG. 6.

Figure 6:
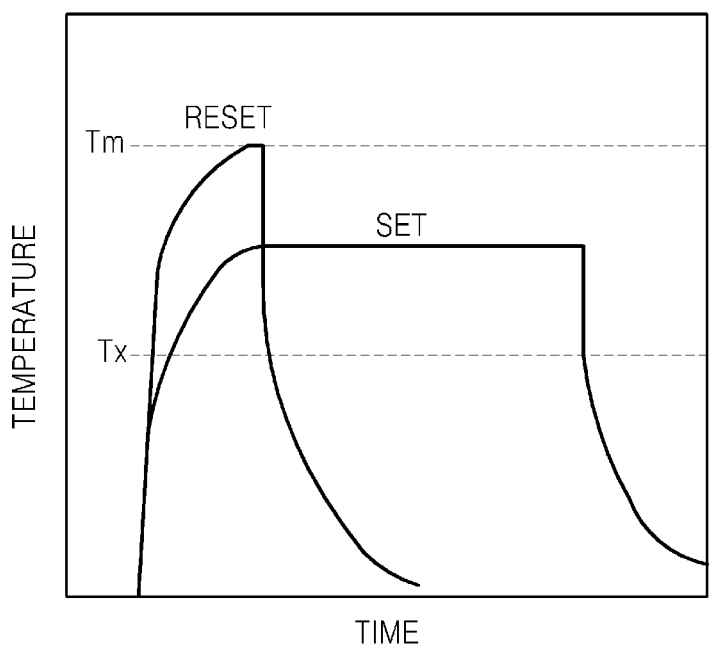
FIG. 6 is a time-temperature graph showing a method of programming a memory portion of the semiconductor device of FIG. 3.

FIG. 6 is a graph showing a method of performing set or reset programming with respect to the phase change material 160 of the device shown in FIG. 3.

Referring to FIG. 6, if the phase change material is heated to a temperature between a crystallization temperature Tx and a melting point Tm for a predetermined period of time and then is gradually cooled, the phase change material assumes a crystallized state. The phase change material has a certain resistance in its crystallized state. Thus, the crystallized state can be read as a set state in which it is considered that the data stored has a value of '0'. On the other hand, if the phase change material is heated to a temperature higher than the melting point Tm and then is cooled, the phase change material assumes an amorphous state. The phase change material has a different resistance in its amorphous state. Thus, the amorphous state can be read a reset state in which it is considered that the data stored has a value of '1'. In other words, the current supplied to the phase change material is controlled to program the phase change material (i.e., to write data), and data may be read by measuring the resistance of the phase change material.

Meanwhile, the temperature to which the phase change material can be heated is proportional to the amount of current supplied and so the level of current that is to be supplied limits the ability to increase the degree to which the memory device can be integrated. Also, the phase change memory device requires a relatively great amount of power to operate considering that converting the phase change material layer into its amorphous state (the reset state) requires a higher amount of current than converting the phase change material layer into its crystallized state (the set state). Accordingly, if the phase change memory device is to have low power consumption, the state (crystallized or amorphous) of the phase change material must be capable of being converted using only a small amount of current. In particular, in order to realize a highly integrated phase change memory device, the amount of current used to convert the phase change material layer into an amorphous state, that is, a reset current, must be minimized.

Referring back to FIGS. 2 and 3, the memory device generally includes a plurality of the unit cells 2 each including a memory portion 3 (FIG. 2) comprising phase change material (160 in FIG. 3) and an access portion 4 (FIG. 2). The phase change material 160 is interposed between the lower electrode 140 (FIG. 3) and the upper electrode 170 (FIG. 3), and the access portion 4 is electrically connected to the lower electrode 140. The phase change material 160 is heated to a temperature between its crystallization temperature and melting point by write current supplied via the lower electrode 140 and access portion 4. More specifically, write current supplied via the lower electrode 140 and the access portion 4 generates Joule's heat at an interface between the lower electrode 140 and the phase change material 160. The amount of Joule's heat is proportional to the write current.

A parameter tested by the burn-in test (S400) may be the current supplied to the phase change material 160 via the lower electrode 140 and the access portion 4.

Furthermore, the burn-in test simulates conditions that are severer than those prevailing during normal use of the memory device (that is, typical conditions prevailing when consumers are using a product in which the memory device is incorporated). More specifically, in the burn-in test, the load applied to the memory device is greater than the load specified for the device for its normal operation, that is the load applied during a normal operation of the memory device in the consumer product for which the device is designed. The burn-in test thus may detect a defect in the memory device, for example, infant life time failure (ILT), at the beginning of a product life cycle.

However, the relatively high load applied to the memory device during the burn-in test can cause micro-voids to form in typical phase change material. Also, such micro-voids can be formed in typical phase change material during the formation of the memory device, i.e., even before fab-out.

According to the inventive concept, as described above, the wafer is thermally treated (S500) after the fab-out or after the fab-out and the burn-in test, to remove any micro-voids in the phase change material. Specifically, the thermal treatment process is performed to densify the phase change material layer and thereby remove micro-voids.

Examples of the thermal treatment process, according to the inventive concept, will be described with reference to the graphs of FIGS. 7 through 12. In these graphs, temperature generally refers to the actual temperature to which the wafer (and specifically, the phase change material on the wafer) is heated but may also refer to the temperature to which apparatus for heating the wafer is set.

Figure 7:
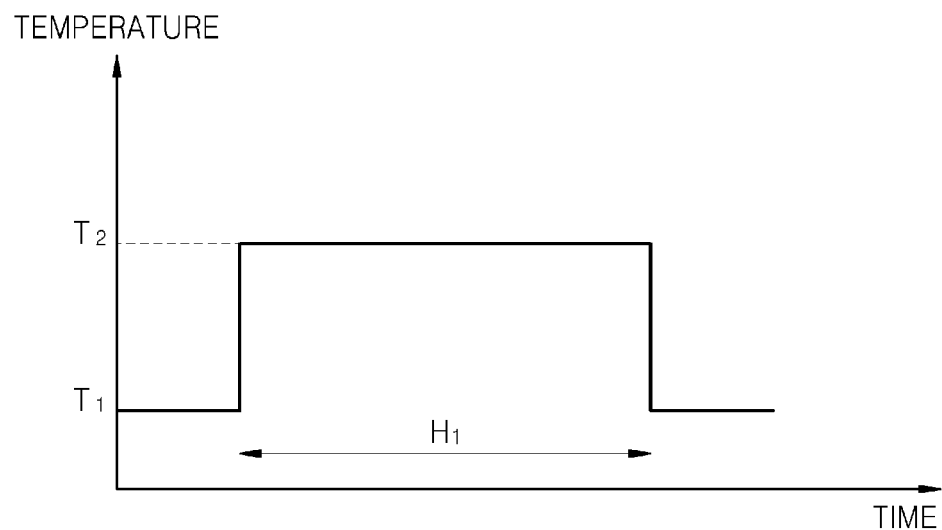
FIGS. 7 through 12 are time-temperature graphs of examples of thermal treatment processes in methods of fabricating a semiconductor device according to the inventive concept.

In the example shown in FIG. 7, the thermal treatment process includes a phase in which the wafer is placed in an atmosphere having a first temperature $T_1$ lower than the crystallization temperature of the phase change material, and a second phase consisting of a thermal treatment carried out at a temperature $T_2$ for period $H_1$, wherein the second temperature $T_2$ is higher than the crystallization temperature of the phase change material and lower than the melting point of the phase change material.

Figure 8:
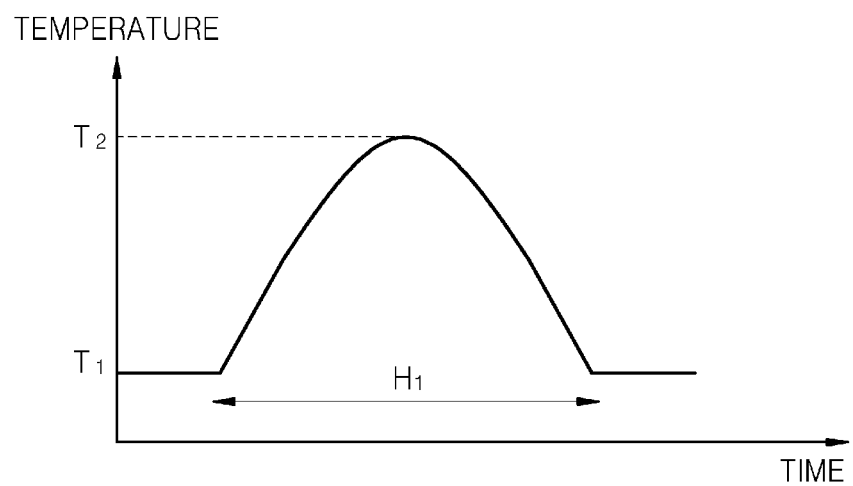

In the example shown in FIG. 8, the thermal treatment process includes a phase in which the wafer is placed in an atmosphere having a first temperature $T_1$, and a second phase in which the temperature is gradually increased from the first temperature $T_1$ to the second temperature $T_2$ and then gradually decreased from the second temperature $T_2$ to the first temperature $T_1$ over the period $H_1$. Again, here the first temperature $T_1$ is lower than the crystallization temperature of the phase change material and the second temperature $T_2$ is higher than the crystallization temperature of the phase change material and lower than a melting point of the phase change material.

Figure 9:
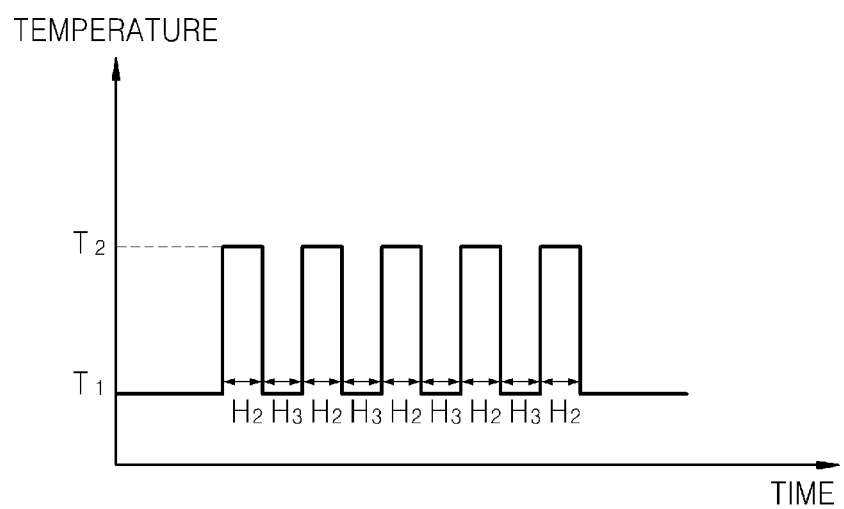

In the example shown in FIG. 9, the thermal treatment process is a pulse-type of thermal treatment in which the temperature, duration of and interval between the pulses are constant. More specifically, after the first phase in which the wafer is placed in an atmosphere having a first temperature $T_1$, pulses of heat are supplied in a second phase with each pulse at a second temperature $T_2$ for a predetermined period of time $H_2$. In this example, the temperature is returned to the first temperature $T_1$ for a predetermined period of time $H_3$ between each of the pulses.

Figure 10:
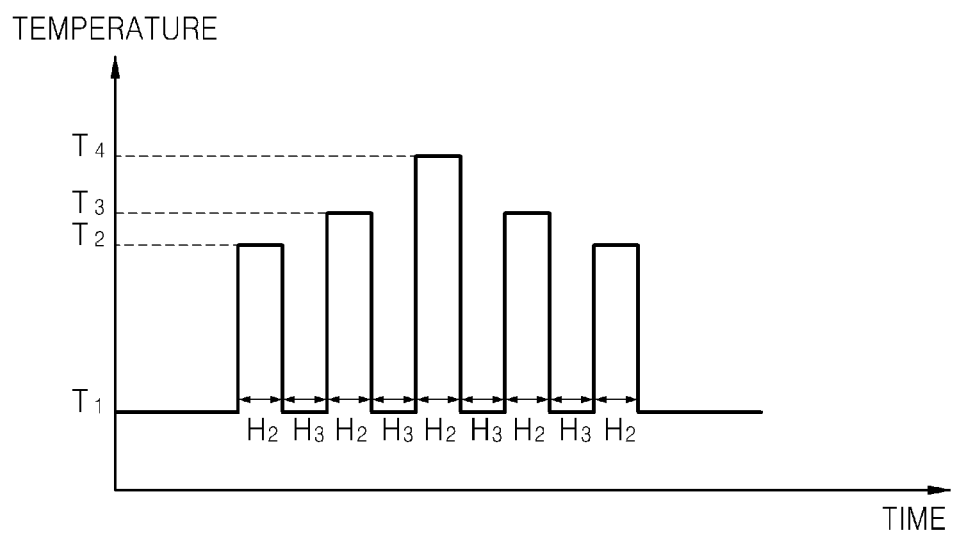

In the example shown in FIG. 10, the thermal treatment process is also a pulse-type thermal treatment in which the duration and interval between the pulses are constant, but in which the temperature of the pulses gradually increases from a second temperature $T_2$ to a third temperature $T_3$ and fourth temperature $T_4$, and then decreases from the fourth temperature $T_4$ to the third temperature $T_3$ and second temperature $T_2$ over time. In this example, each of the second temperature $T_2$ the third temperature $T_3$, and the fourth temperature $T_4$ is higher than the crystallization temperature of the phase change material and lower than the melting point of the phase change material.

Figure 11:
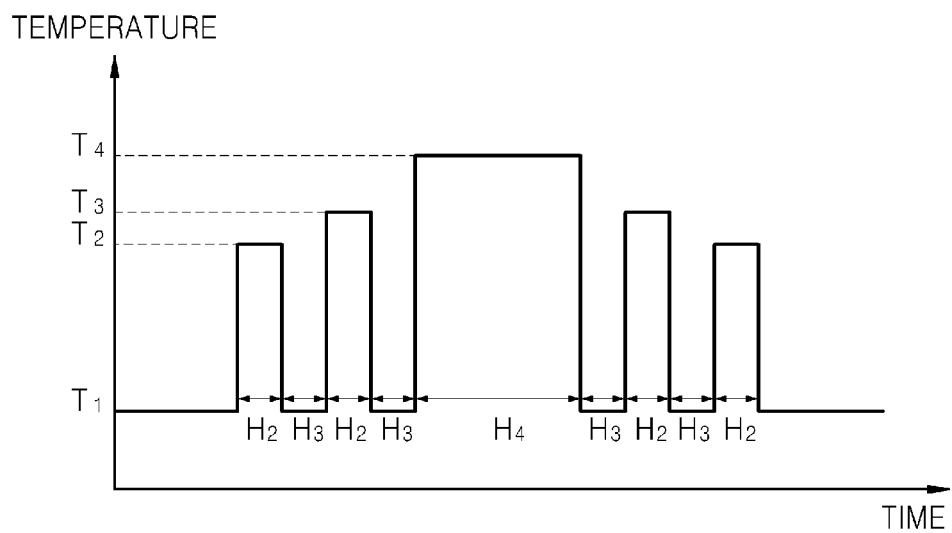
Figure 12:
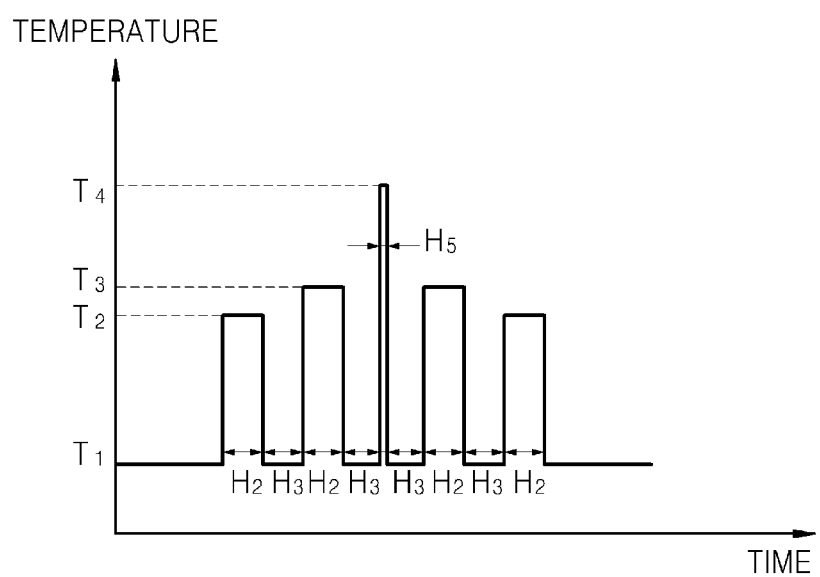

In each of the examples shown in FIGS. 11 and 12, the thermal treatment process is also a pulse-type thermal treatment in which the temperature of the pulses gradually increases and then decreases over time. However, in each of these examples the duration of the pulse that provides the highest temperature is different than the duration of the other pulses.

In the example shown in FIG. 11, the duration $H_4$ of the pulse at the fourth temperature $T_4$, which is the highest temperature, is longer than the duration $H_2$ of the pulses at the second temperature $T_2$ and third temperature $T_3$. In the example shown in FIG. 12, the duration $H_5$ of the pulse at the fourth temperature $T_4$ is shorter than the duration $H_2$ of the pulses at the second temperature $T_2$ and the third temperature $T_3$.

Apparatus that may be used to conduct the thermal treatment of the wafer include baking apparatus or furnaces, rapid thermal processing (RTP) apparatus, and ultrasonic devices.

A baking apparatus, as an example of the apparatus that can be used for thermally treating the wafer to densify the phase change material thereon according to the inventive concept, will now be described in detail with reference to FIG. 13.

Figure 13:
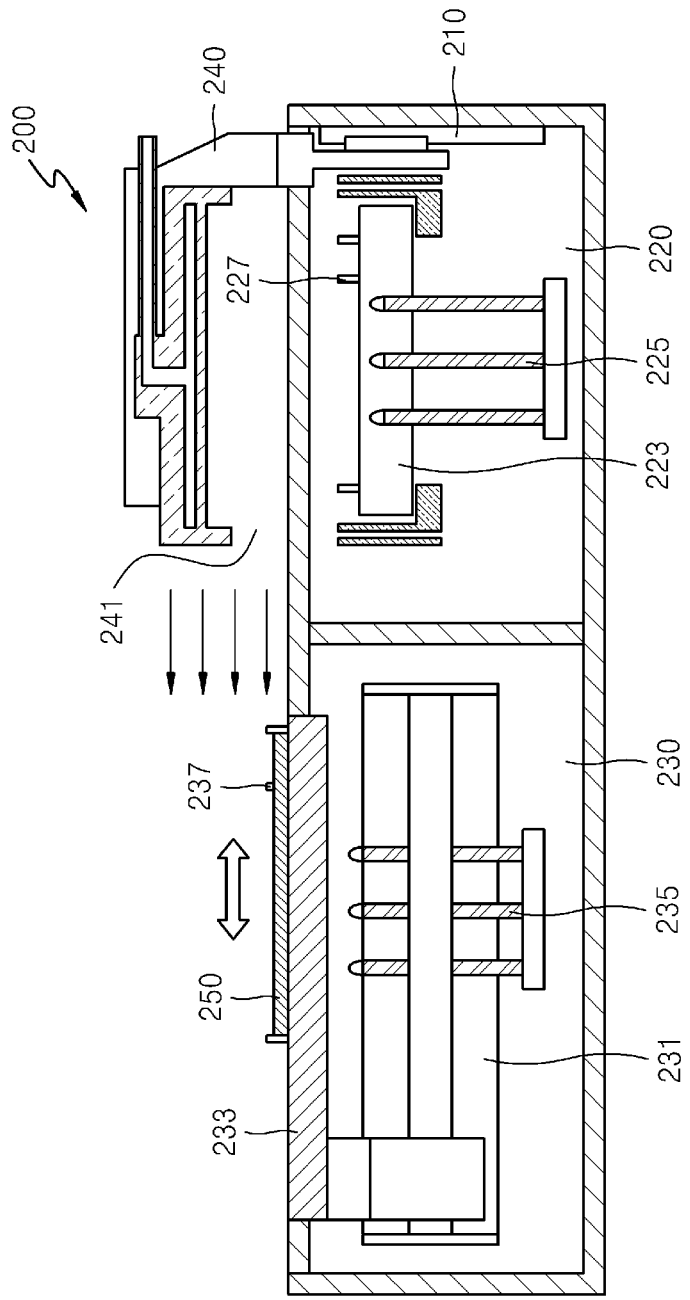
FIG. 13 is a cross-sectional view of an apparatus that can perform a thermal treatment process in a method of fabricating a semiconductor device according to the inventive concept.

Referring to FIG. 13, the baking apparatus 200 includes a hot plate block 220 for baking a wafer 250 and a cool plate block 230 where the wafer 250 is placed on standby.

The hot plate block 220 includes a process chamber 210, and a cover 240 that is movable up and down relative to the process chamber to open the chamber 210 (by providing a wafer slot 241 when in the raised position) and close the chamber 210. An exhaust pipe extends through the cover 240 so as to exhaust air from the process chamber 210 after a baking process. The hot plate block 220 also includes a hot plate 223 in the process chamber 210, and wafer supporting pins 225 supported below the hot plate 223 but which can be raised and lowered through the hot plate 223. To this end, the hot plate 223 has through-holes through which the wafer supporting pins 225 may pass. Furthermore, wafer guides 227 protrude upwardly from an upper surface of the hot plate 223 so as to guide the wafer 250 to a mounting position. A hot wire embedded in the body of the hot plate 223 heats a wafer 250 mounted on the hot plate 223.

The cool plate block 230 includes a cool plate 233. The cool plate 233 is where the wafer 250 waits on standby for transfer to the process chamber 210, or where a wafer 250 baked in the process chamber 210 is set to cool. A wafer guide 237 protrudes upwardly from an upper surface of the cool plate 233 so as to guide the wafer 250 to a mounting position on the cool plate 233. Wafer supporting pins 235 are supported below the cool plate 233 but can be raised and lowered through the cool plate 233. To this end, the cool plate 233 has a plurality of through-holes through which the wafer supporting pins 235 may pass. Also, a coolant line (not shown) is embedded in the body of the plate 233 and coolant is circulated through the line to cool a wafer 250 mounted on the cool plate 233. The cool block 230 also includes a driving unit 231 for moving the cool plate 233 forward or backward toward or away from the hot plate block 220.

An operation of the baking apparatus 200 will now be described. First, the cool plate 233, on which a wafer 250 is mounted, is moved toward the process chamber 210 to a standby position by the driving unit 231. At this time, the cover 240 is in its raised or open position. The wafer 250 that is on standby on the cool plate 233 is then inserted into the wafer slot 241 by a wafer transfer arm (not shown). Then, the wafer supporting pins 225 are raised to support the wafer 250, the transfer arm is subsequently withdrawn, and then the wafer supporting pins 225 are lowered. As a result, the wafer 250 is lowered onto and thereby mounted on the hot plate 223. Then the cover 240 is closed, and the wafer 250 mounted on the hot plate 223 is baked.

Once the baking operation is finished, the cover 240 is opened, and the wafer supporting pins 225 are raised, and thus the baked wafer 250 is lifted off of the hot plate 223 and is supported by the wafer supporting pins 225. The baked wafer 250 is transferred through the wafer slot 241 by the wafer transfer arm. At this time, the wafer supporting pins 235 of the cool block are raised and the wafer transfer arm is withdrawn, and thus the wafer 250 is supported by the wafer supporting pins 235. The wafer supporting pins 235 are then lowered to set the wafer 250 on the cool plate 233. The cool plate 233 cools the wafer 250.

Any of the thermal treatment processes described above with reference to FIGS. 7 through 12 may be performed on the wafer by the above-described baking apparatus 200. For example, the first temperature $T_1$ may be provided by the cool plate block 230, and the second temperature $T_2$ the third temperature $T_3$, and the fourth temperature $T_4$ may be provided by the hot plate block 220.

Figure 14:
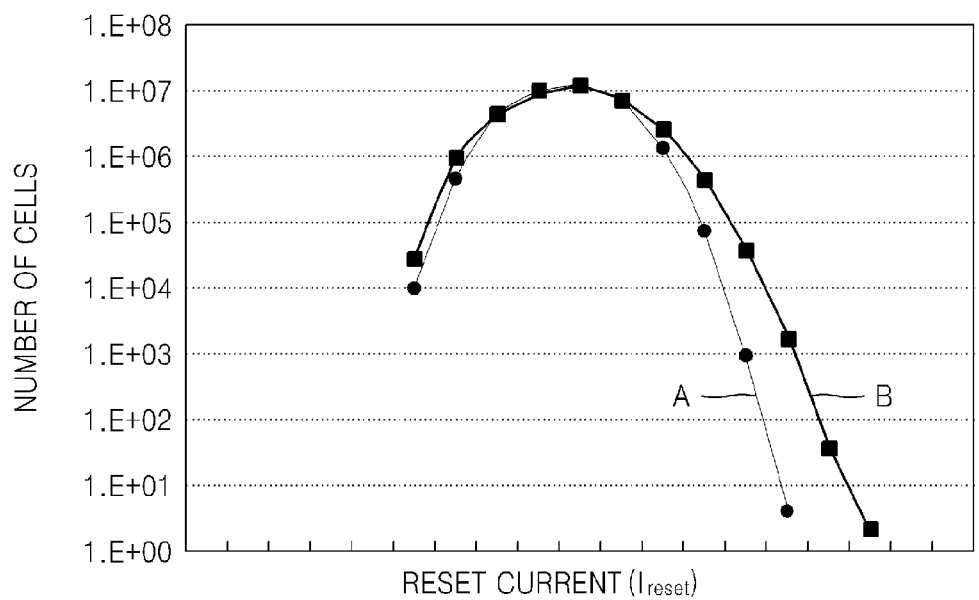
FIGS. 14 through 16 are graphs each of the distribution of reset current in an example of a method of fabricating a semiconductor device according to the inventive concept and in a comparative example of a similar method but in which a thermal treatment for densifying phase change material of the device is not performed.
Figure 15:
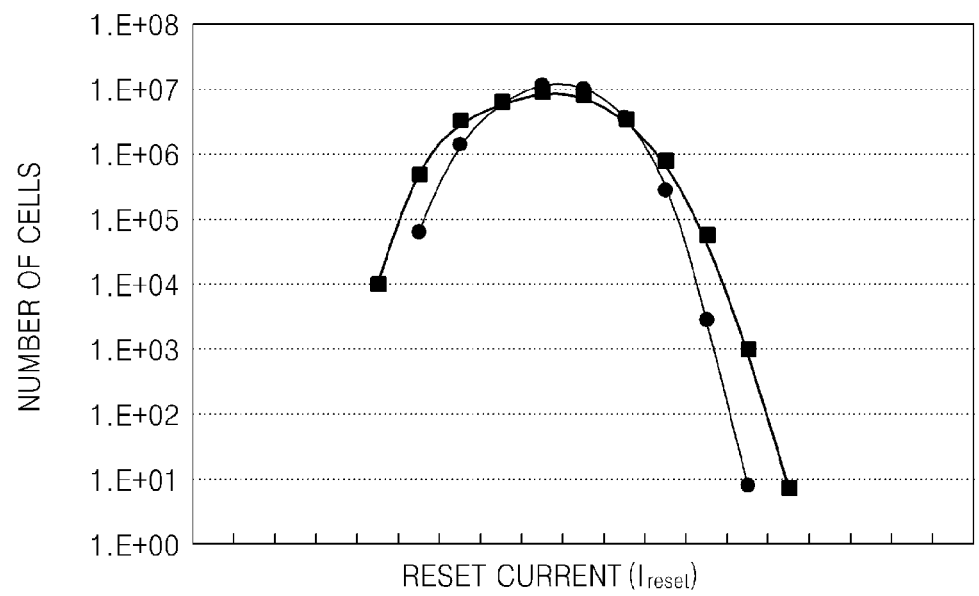
Figure 16:
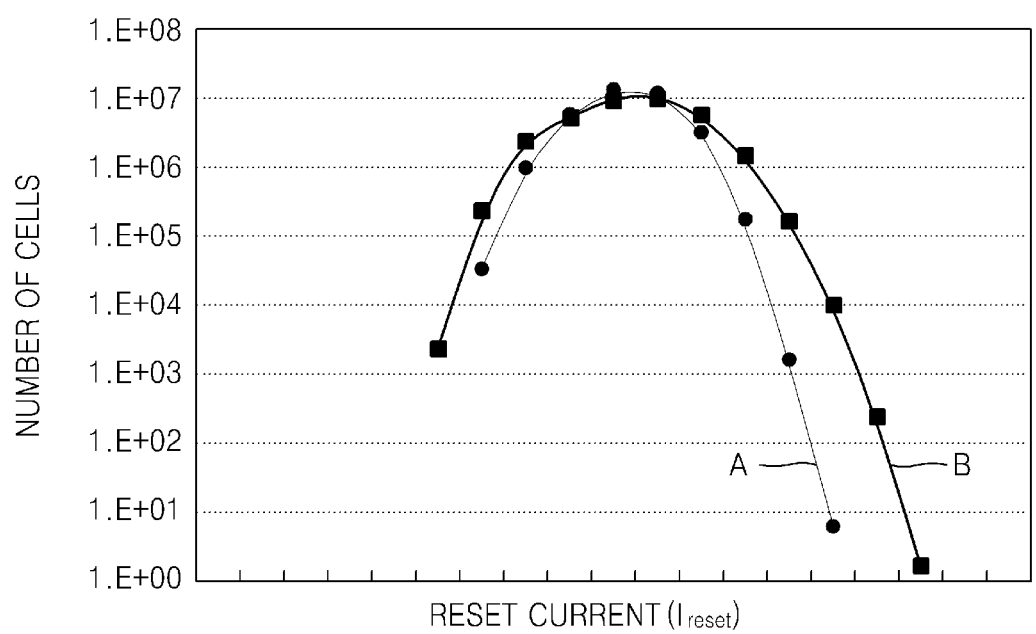

FIGS. 14 through 16 are graphs each showing the distribution of reset current for a memory array of cells, wherein each cell has a memory portion comprising phase change material. In this case, the phase change material was a GST phase change material including germanium (Ge), antimony (Sb), and tellurium (Te). Furthermore, in each of the graphs of FIGS. 14 through 16, plot A shows the distribution of reset current in the case in which the cells were not thermally treated and plot B shows the distribution of reset current in the case of cells which were thermally treated, i.e., in the case in which the memory cell array was fabricated according to the inventive concept.

Moreover, in the graph of FIG. 14, the results shown by plot B are of a method in which the thermal treatment process to densify the phase change material was performed, after a burn-in test, and consisted of baking the wafer at a constant temperature of 220° C. for two hours. In the graph of FIG. 15, the results shown by plot B are of a method in which the thermal treatment process to densify the phase change material was performed, after a burn-in test, and consisted of baking the wafer at a constant temperature of 260° C. for two hours. In the graph of FIG. 16, the results shown by plot B are of a method in which the thermal treatment process to densify the phase change material was performed, after a burn-in test, and consisted of baking the wafer at a constant temperature of 300° C. for two hours. Meanwhile, and although not shown, similar results were obtained in each of these cases when the thermal treatment process was carried out from anywhere from one to three hours.

The results illustrated in FIGS. 14 through 16 confirm that a thermal treatment process performed on the wafer to densify the phase change material of a semiconductor device according to the inventive concept can improve the durability of the semiconductor device.

Furthermore, the temperatures provided in the thermal treatment processes used to obtain the results B plotted in the graphs of FIGS. 14 through 16 were higher than the crystallization temperature of the phase change material and lower than the melting point of the phase change material. The melting point of phase change material depends, in general, on the strength of bonds of a basic composition of the material and hence, the melting point of phase change material rarely varies among phase change material having similar compositions but different dopant concentrations. However, the crystallization temperature of phase change material can be altered by doping the material, i.e., may depend on the concentration of dopant in the material. Also, the crystallization temperature of GST phase change material including Ge, Sb, and Te is dependent on the relative amounts of Ge, Sb, and Te in the composition, as illustrated in FIGS. 17 and 18.

Referring to these figures, conventional GST phase change material has an atomic composition ratio of Ge:Sb:Te of 2:2:5 and is thus referred to as GST 225. Thus, in the composition of conventional GST phase change material, i.e, in GST 225, the atom % of Ge in the composition is 22.2 atom %, of Sb in the composition is 22.2 atom %, and of Te in the composition is 55.5 atom %. Furthermore, the crystallization temperature of GST 225 is 150° C. On the other hand, the melting point of GST 225 is about 630° C.

Accordingly, although GST 225 resists changing its state from crystalline to amorphous, the state of the GST 225 phase change material can readily undergo a change from amorphous to crystalline. Therefore, phase change material having a higher crystallization temperature and thus, an improved retention characteristic, is provided according to an aspect of the inventive concept.

Figure 17:
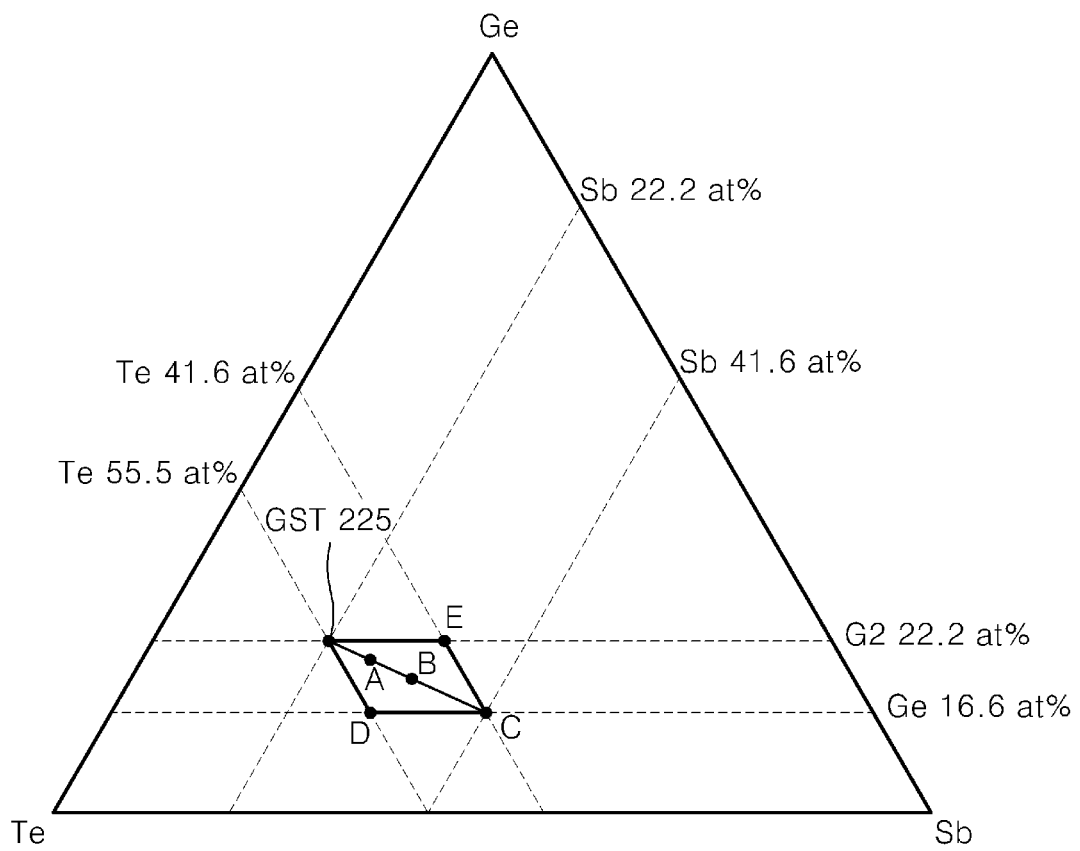
FIG. 17 is a ternary system diagram of GST phase change material.
Figure 18:
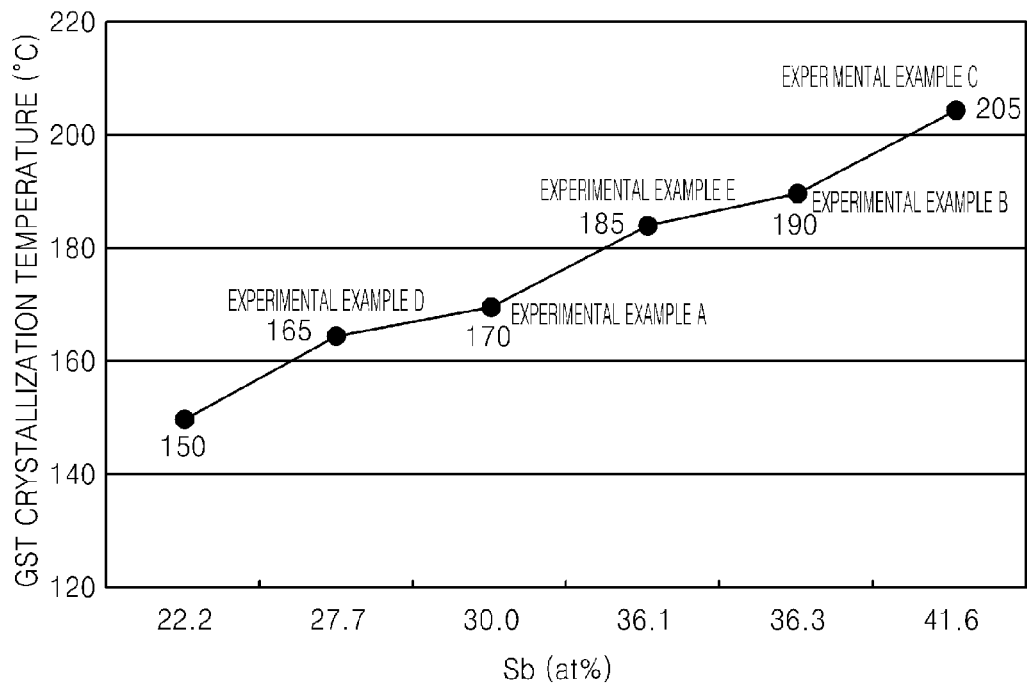
FIG. 18 is a graph of crystallization temperatures of examples of compositions of phase change material formed in method of fabricating a semiconductor device according to the inventive concept.

Table 1 shows the crystallization temperatures of various compositions of GST phase change material, as extracted from FIGS. 17 and 18.

TABLE 1

| atomic composition ratio of Ge, Sb, and Te | | | at % | | | crystallization temperature (° C.) | experimental example |
|---|---|---|---|---|---|---|---|
| Ge | Sb | Te | Ge | Sb | Te | | |
| 2 | 2 | 5 | 22.2 | 22.2 | 55.5 | 150 | |
| 3 | 5 | 10 | 16.6 | 27.7 | 55.5 | 165 | D |
| 2 | 3 | 5 | 20.0 | 30.0 | 50.0 | 170 | A |
| 8 | 13 | 15 | 22.2 | 36.1 | 41.6 | 185 | E |

TABLE 1-continued

| atomic composition ratio of Ge, Sb, and Te | | | at % | | | crystallization temperature (° C.) | experimental example |
|---|---|---|---|---|---|---|---|
| Ge | Sb | Te | Ge | Sb | Te | | |
| 2 | 4 | 5 | 18.1 | 36.3 | 45.4 | 190 | B |
| 2 | 5 | 5 | 16.6 | 41.6 | 41.6 | 205 | C |

As can be understood from Table 1, the crystallization temperature of the GST phase change material of each experimental example is greater than the crystallization temperature of GST 225 (150° C.). Also, as the ratio of Sb increases, the crystallization temperature increases. Therefore, Sb is the main element in GST that determines its crystallization temperature. Accordingly, in an example of the inventive concept, the memory portion 3 (FIG. 2) is fabricated to include phase change material 160 (FIG. 3) comprising a composition of GST wherein the atomic % of Sb in the composition is greater than 22.2 and preferably is at least 27.7.

Meanwhile, if at least one group I element selected from the group consisting of B, C, N, and O is added to the phase change material, its crystallization temperature can be increased, although the effect that such an additive has on the increasing the crystallization temperature is less than the effect that increasing the atomic % of Sb has. In any case, B may be added to the phase change material by ion implantation. N or O may be supplied to the phase change material by exposing the phase change material to an N- or O-based atmosphere under a high temperature. C may be added to the phase change material by sputtering deposition.

Thus, in examples of a method of fabricating a semiconductor device according to the inventive concept, the memory portion is fabricated of phase change material including Ge, Sb, and Te and having a crystallization temperature greater than 150° C. and preferably 165° C. or higher, and the thermal treatment is carried out at a temperature higher than the crystallization temperature to densify the phase change material. Through various experiments conducted by the present inventor, a thermal treatment providing a process temperature higher than 220° C. will ensure that the phase change material is sufficiently densified. Preferably, therefore, the thermal treatment is carried out in a range of 220° C. to 300° C.

Figure 19:
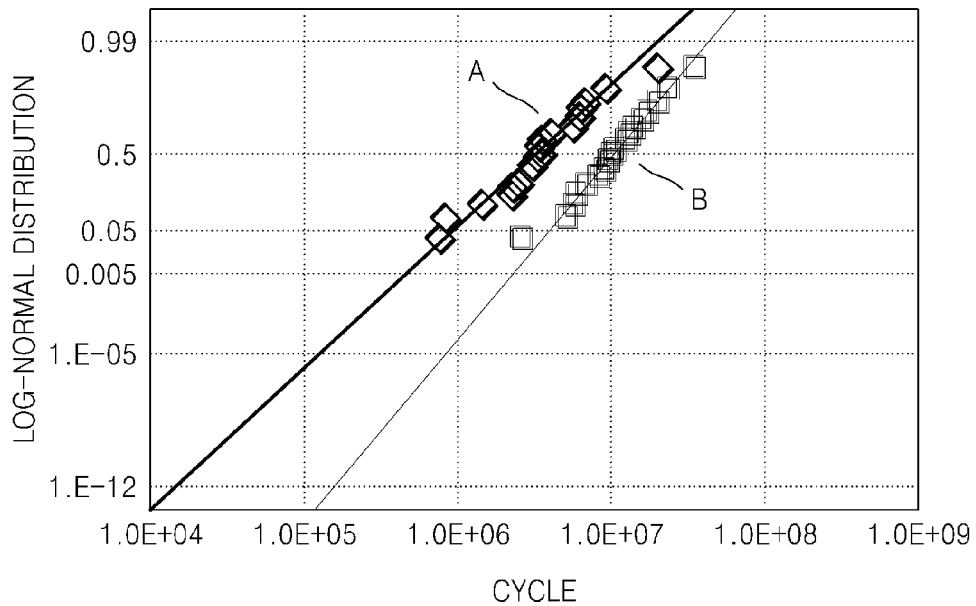
FIG. 19 is a graph of the endurance of a semiconductor device fabricated according to the inventive concept and of the endurance of a comparative example of a semiconductor device fabricated by a similar method but in which a thermal treatment for densifying phase change material of the device is not performed.

FIG. 19 offers another form of comparison between a semiconductor device fabricated to include a thermal treatment process according to the inventive concept such that the phase change material of the device is densified (plot B), and a corresponding device in which the thermal treatment process is not used in fabricating the device (plot A).

In the method used to obtain the results of plot B (the case of the inventive concept), a wafer is thermally treated at a constant temperature of 250° C. for two hours using a baking apparatus to densify the phase change material of its memory cells. As plots A and B make clear, the endurance of the semiconductor device is improved by incorporating the thermal treatment into the manufacturing process.

Figure 20:
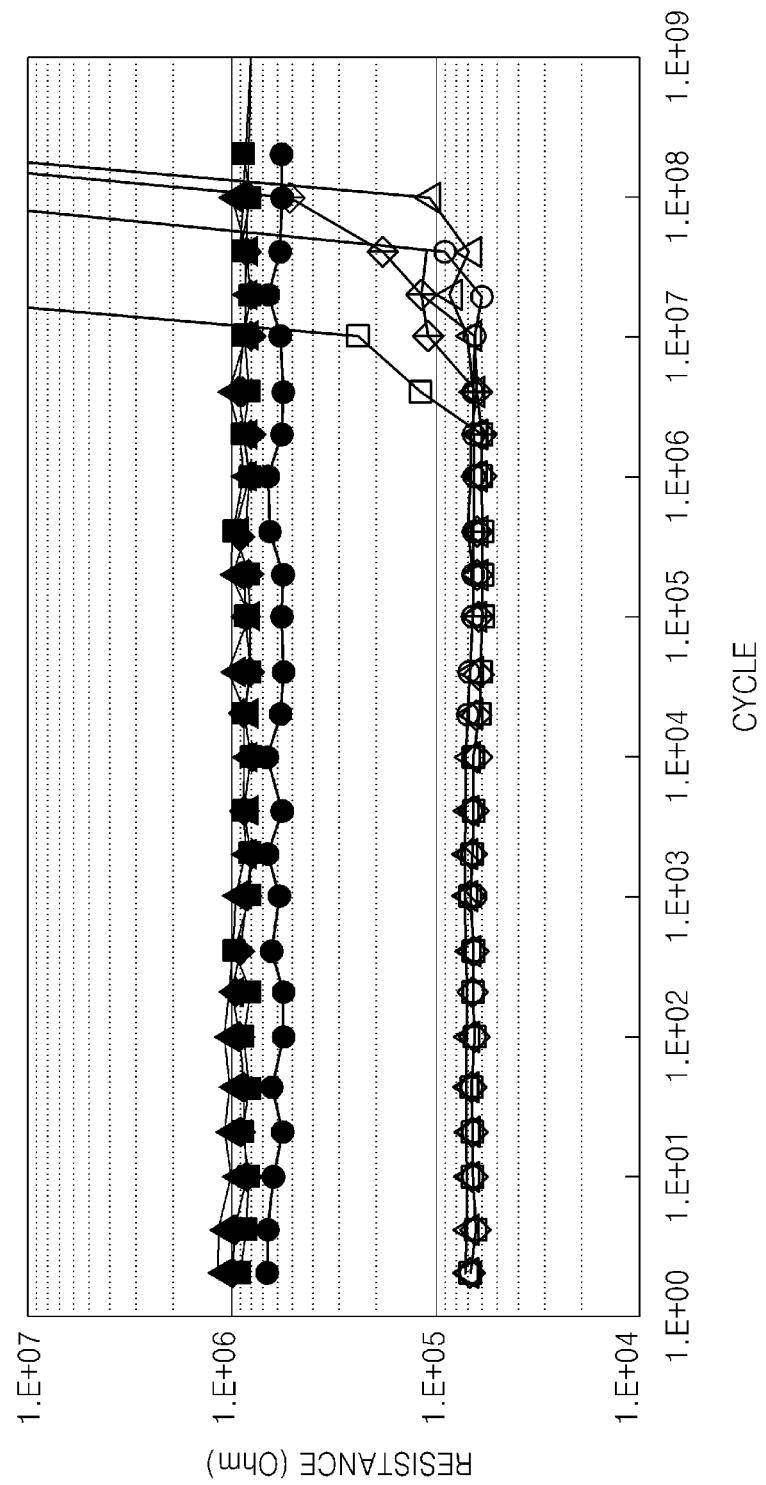
FIG. 20 is a graph of the results of an experiment for checking the endurance of a comparative example of a semiconductor device fabricated by a method in which neither a burn-in test nor a thermal treatment for densifying phase change material of the device is performed.
Figure 21:
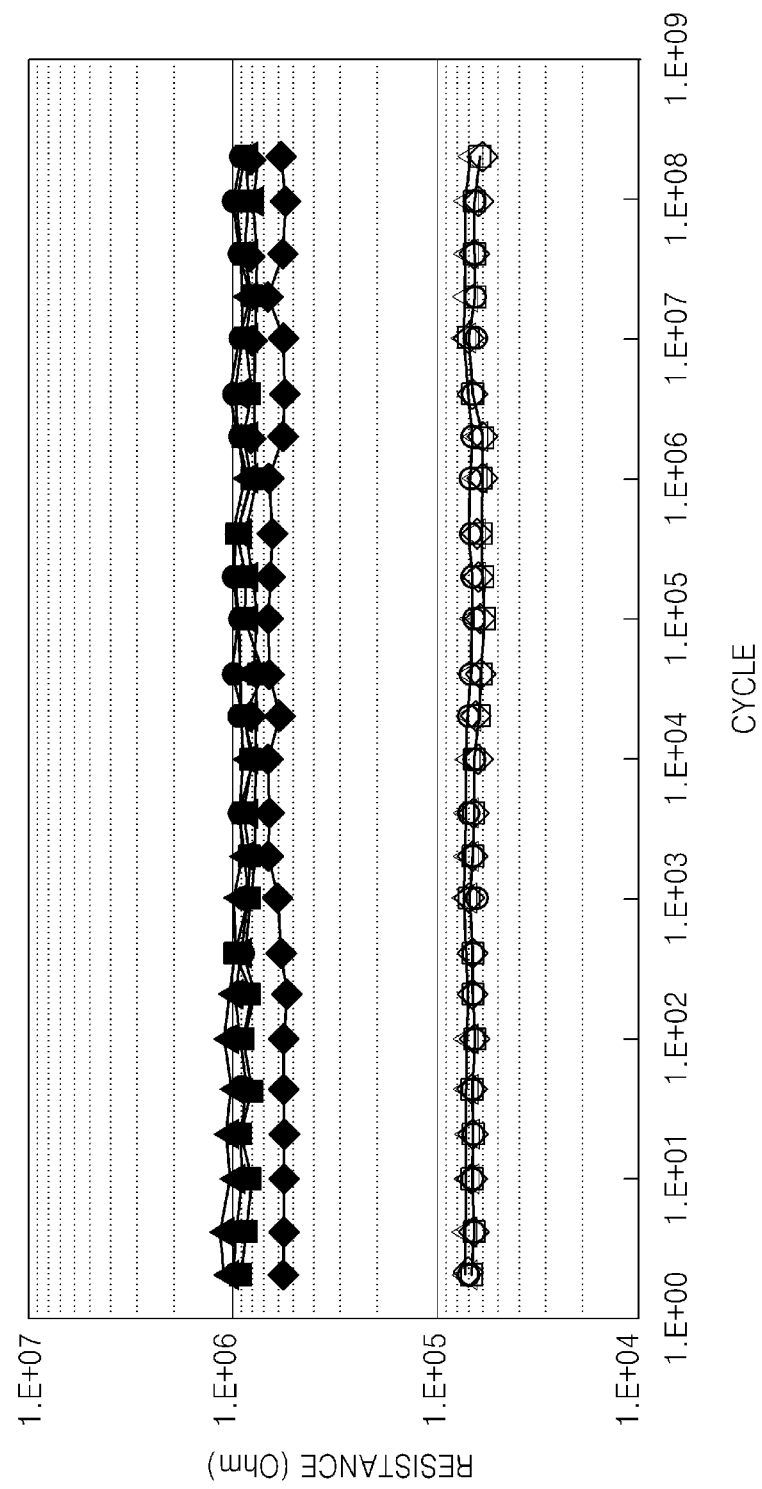
FIG. 21 is a graph of results of the same experiment but run on a semiconductor device fabricated by a method a burn-in test and a thermal treatment for densifying phase change material of the device is performed according to the inventive concept.

FIGS. 20 and 21 offer still another form of comparison between a semiconductor memory device fabricated to include a thermal treatment process according to the inventive concept such that the phase change material of the device is densified (FIG. 21), and a corresponding device in which the thermal treatment process is not performed (FIG. 20). More specifically FIGS. 20 and 21 show the results of experiments in which a write operation is repeated over a number of cycles on the devices, and wherein for each cycle the reset resistance (a high resistance) is on the order of 1.E+06 and the set resistance (a low resistance) is on the order of 1.E+05.

As the results shown in FIG. 20 indicate, a set-stuck fail phenomenon or a reset-stuck fail phenomenon occurred after a certain number of cycles. The set-stuck fail phenomenon is a phenomenon in which the memory device is stuck in a set state even though there is an attempt to perform a writing operation to program a reset state. On the other hand, the reset-stuck fail phenomenon is a phenomenon in which the device is stuck in a high resistance state, and thus can not be converted into a set state.

In the method used to obtain the results of FIG. 21 (the case of the inventive concept), the phase change material of the memory device was thermally treated at a constant temperature of 250° C. for two hours using a baking apparatus to densify the phase change material. As the results of FIG. 21 indicate, the set-stuck fail phenomenon or the reset-stuck fail phenomenon did not occur for at least the same number of cycles where the failures occurred in the corresponding device whose phase change material was not thermally treated so as to be densified.

A more specific example of the method of manufacturing a semiconductor device, according to the inventive concept, will now be described with reference to the flowchart of FIG. 22.

Figure 22:
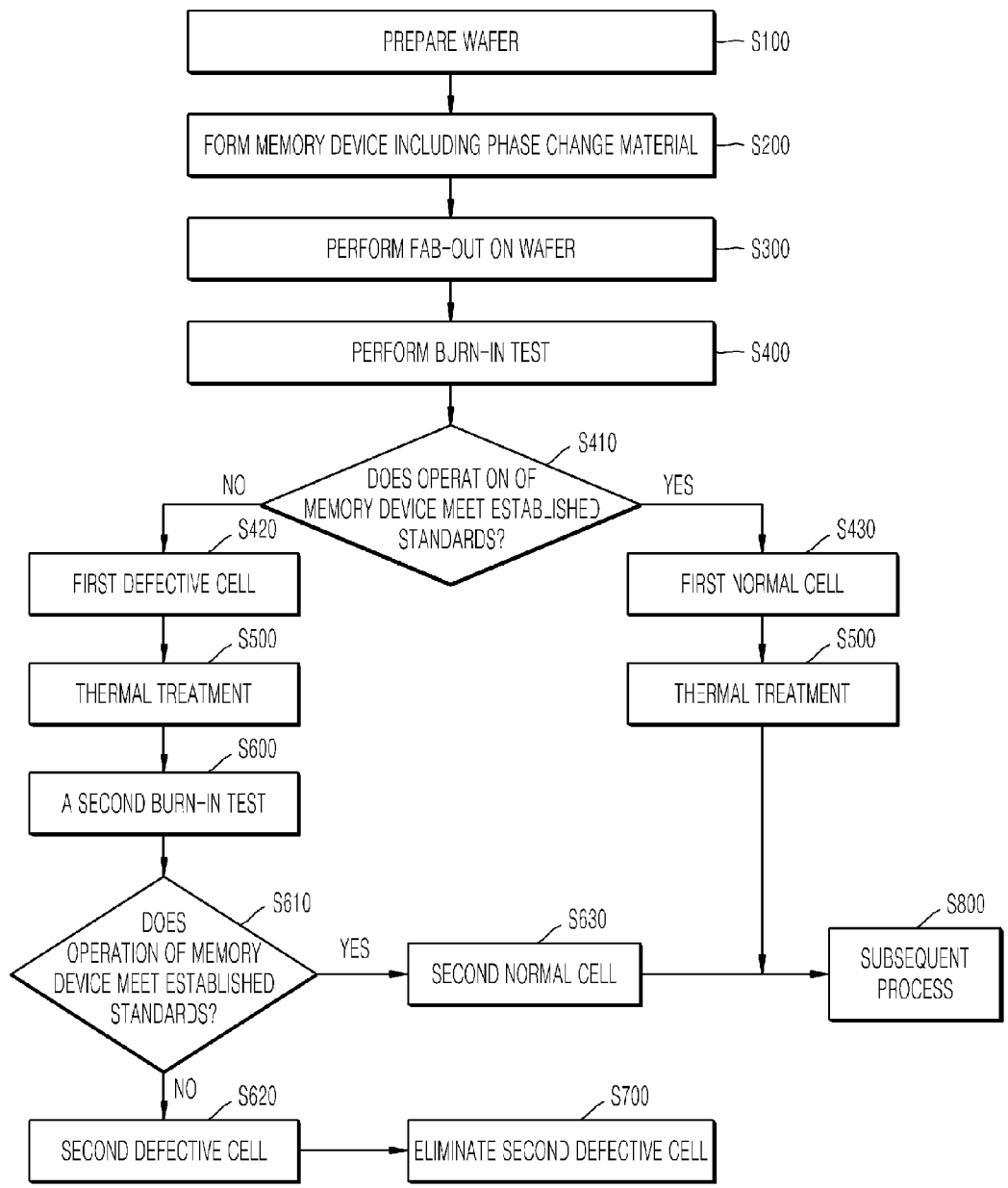
FIG. 22 is a flowchart of another embodiment of a method of manufacturing a semiconductor device, according to the inventive concept.

Referring to FIG. 22, the process of providing a wafer (S100), the process of forming a memory device including phase change material on the wafer (S200), the fab-out of the wafer (S300), and the process of performing a first burn-in test on the memory device (S400) are similar to those described above with reference to FIG. 1 and thus, will not be described in detail again.

The burn-in test (S400), referred to hereinafter as the first burn-in test, is used to determine (S410) whether the memory device formed on the wafer meets certain specifications by determining whether an operation of the device meets pre-established standards. For example, the first burn-in test (S400) may be used to determine whether a cell of the memory device has an ILT, i.e., a failure at the beginning of a product life cycle.

If it is determined (S410) that the operation of the memory device does not meet the established standards, the memory device is firstly deemed (S420) to have at least one defective cell. That is, in the figure, the term "cell" is used but the method may obviously be applied to the simultaneous testing of more than one cell. On the other hand, if it is determined (S410) that the memory device meets the established standards, the memory device is deemed (S430) to have a normal cell or cells.

In either case, though, a thermal treatment process (S500) is performed on the wafer to densify the phase change material. The thermal treatment process may be any of those described above, and thus will not be described here in detail.

In the case in which the memory device is deemed (S420) to have a defective cell, the thermal treatment process (S500) is performed in an attempt to restore the cell to an operational state by again densifying the phase change material of the cell. Subsequently, a second burn-in test (S600) is performed. The second burn-in test may comprise applying a higher load to the memory device than under a normal operating condition of the memory device, but wherein the load is less than that applied to the memory device during the first burn-in test (s400).

The second burn-in test (S600) is performed to determine (S610) whether an operation of the memory device formed on the wafer meets established standards (S610), i.e., whether in fact the defective cell has been restored determining If the results of the second burn-in test (S600) indicate that the operation of the memory device still does not meet the established standards, the memory device is again or secondly deemed (S620) as having a defective cell. Again, the defect detected for by the second burn-in test (S600) may be an ILT. On the other hand, if the results of the second burn-in test (S600) indicate that the operation of the memory device meets the established standards, the memory device is deemed (S630) as having a normal cell.

Once a thermal treatment has been carried out and the memory device is deemed to have a normal cell (at either 5630 or at 5500 in the flow of the process shown in FIG. 22), the memory device is subjected to a subsequent process (S800) such as a packaging process. On the contrary, if the memory device is deemed as again having a defective cell (S620), the device having the defective cell is culled or eliminated (S700). Thus, the subsequent process is not carried out on the memory device in which the cell was determined as being defective for a second time. Alternatively, though, as occasion demands, an additional thermal treatment process may be performed in an attempt to restore the second defective cell.

Figure 23:
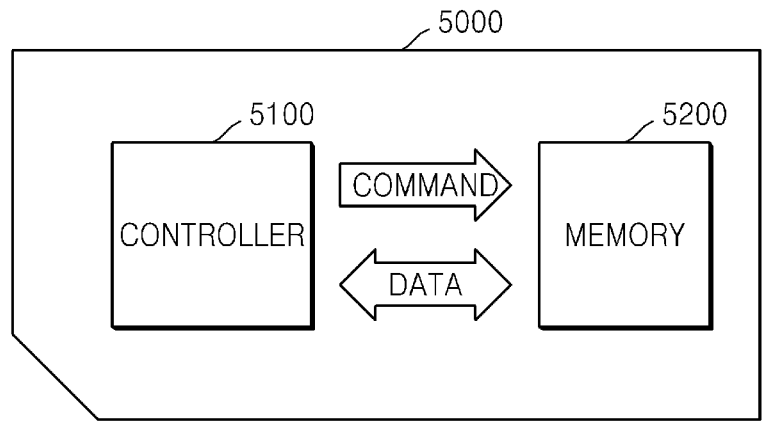
FIG. 23 is a schematic block diagram of a memory card that employs a semiconductor device fabricated according to the inventive concept.

An example of a memory card, that may employ a semiconductor device fabricated according to the inventive concept, is shown in FIG. 23. The memory card 5000 may be a memory stick card, a smart media (SM) card, a secure digital (SD) card, a mini SD card, or a multi media card (MMC).

Referring to FIG. 23, the memory card 5000 has a card body and a controller 5100 and a memory 5200 operatively connected to exchange signals in the card body. For example, the memory 5200 may receive a command signal from the controller 5100 which causes the memory 5200 to transfer data. The memory 5200 in this example includes a semiconductor device fabricated according to the inventive concept. The semiconductor device may have any type of chip architecture or logic gate design known in the art. In particular, the memory 5200 may include a memory array or a memory array bank. The memory card 5000 may also include a conventional column decoder, a row decoder, a plurality of input/output (I/O) buffers, and/or a control register to drive such a memory array bank.

Figure 24:
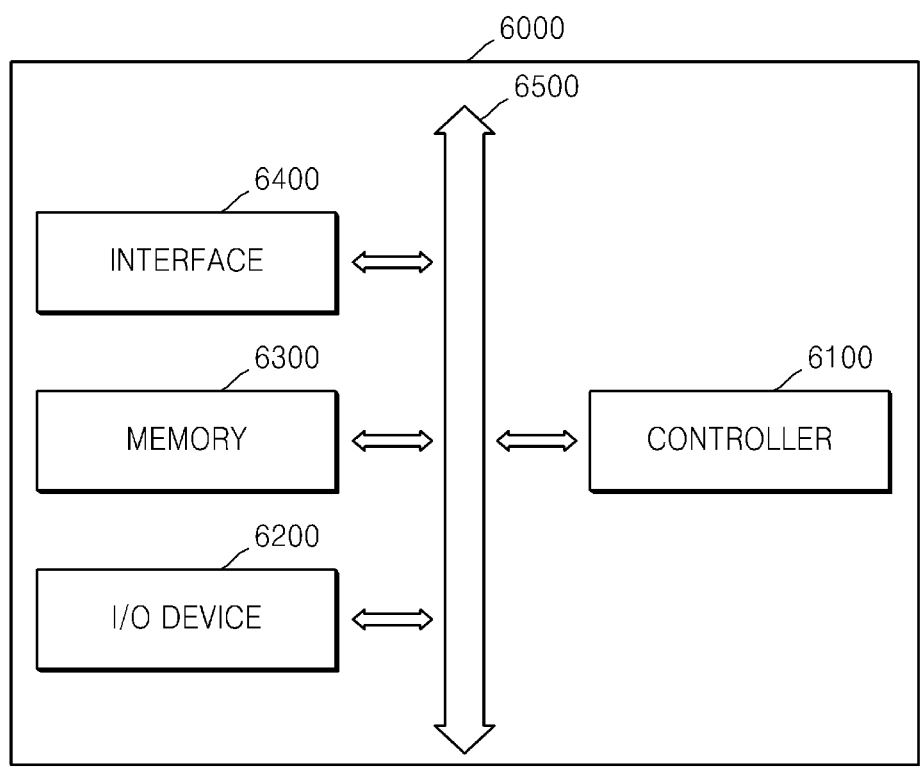
FIG. 24 is a schematic block diagram of a system employing a semiconductor device fabricated according to the inventive concept.

FIG. 24 shows an example of an electronic system employing a semiconductor device fabricated according to the inventive concept. The electronic system 6000 may be used by a mobile device or other system for transmitting/receiving information. For example, the electronic system 6000 may be used by a mobile device, a navigation device, a solid state disk (SSD), or household appliances. Examples of mobile devices that may employ the electronic system 6000 include personal digital assistants (PDAs), laptop computers, web tablets, wireless or mobile phones, MP3 players, portable multimedia players (PMPs) and memory cards.

Referring to FIG. 24, the electronic device 6000 of this example includes a controller 6100, an I/O device 6200, a memory 6300, and an interface 6400. The controller 6100, the I/O device 6200, the memory 6300, and the interface 6400 may communicate with one another via a bus 6500.

The controller 6100 may be a microprocessor, a digital signal processor, a microcontroller, or the like. Thus, the controller 6100 may execute a program and thereby control the overall operation of the device 6000.

The I/O device 6200 is used to input or output data. Thus, the I/O device 6200 may be a keypad, a keyboard, or a display. The device 6000 may be connected to an external device, for example, a personal computer (PC) or a network via the I/O device 6200 so as to exchange data with the external device.

The memory 6300 may store code for operating the controller 6100 and/or data, and/or may store data processed by the controller 6100. The memory 6300 in this example includes a semiconductor device fabricated according to the inventive concept.

The interface 6400 may provide a data transmission path between the system 6000 and another external device.

According to the inventive concept as described above, a thermal treatment process is performed after fab-out to remove micro-voids in phase change material of a memory device formed in the fab. Thus, defects that may occur due to a burn-in test may be cured relatively simply. In any case, a semiconductor device fabricated according to the inventive concept is thus durable and has a long lifespan. Furthermore, the method of manufacturing a semiconductor device according to the inventive concept offers a relatively high product yield.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device, the method comprising:
    forming a memory device comprising phase change material on a wafer;
    completing a wafer level process of manufacturing the semiconductor device;
    densifying the phase change material by subjecting the wafer to a thermal treatment; and
    a first burn-in test on the memory device between the wafer level process and the thermal treatment, wherein the first burn-in test comprises applying an electrical load to the memory device that is higher than the maximum load applied to the memory device during the course of its normal operation.

2. The method of claim 1, further comprising classifying the memory device as defective when results of the first burn-in test indicate that an operation of the memory device is not within predetermined standards, and performing a second burn-in test on a memory device classified as defective, wherein the second burn-in test comprises applying an electrical load to the memory device that is higher than that applied to the memory device during its normal operation and lower than that applied to the memory in the first burn-in test.

3. The method of claim 2, further comprising re-classifying the memory device as defective when results of the second burn-in test indicate that an operation of the memory device is not within predetermined standards; and culling a memory device that has been re-classified as defective to prevent the wafer from being subsequently processed.

4. The method of claim 1, wherein the thermal treatment comprises performing a thermal treatment process at a temperature higher than the crystallization temperature of the phase change material and lower than the melting point of the phase change material.

5. The method of claim 1, wherein the thermal treatment comprises a thermal treatment process in which the temperature of the process is in a range from about 220° C. to about 300° C.

6. The method of claim 1, wherein the thermal treatment consists of a thermal treatment process in which the temperature of the process is maintained substantially constant over the entire time that the wafer is being subjected to the thermal treatment.

7. The method of claim 1, wherein the thermal treatment comprises a process in which the temperature of the process is increased and then decreased over time.

8. The method of claim 1, wherein the thermal treatment comprises a thermal treatment process in which pulses of heat are applied to the wafer over time.

9. The method of claim 8, wherein the maximum temperatures of all of the pulses of heat are substantially the same over the entire time that the wafer is being subjected to the thermal treatment.

10. The method of claim 8, wherein the maximum temperatures of the pulses of heat are gradually increased and then decreased over time.

11. The method of claim 1, wherein the phase change material comprises a chalcogenide material.

12. A method of manufacturing a semiconductor device, the method comprising:
    providing a wafer;
    forming a memory device comprising phase change material on a wafer;
    completing a wafer level process of manufacturing the semiconductor device;
    subsequently performing a burn-in test on the memory device; and
    subsequently densifying the phase change material by subjecting the wafer to a thermal treatment process conducted at a temperature higher than the crystallization temperature of the phase change material and lower than the melting point of the phase change material.

13. A method of manufacturing a semiconductor device, the method comprising:
    forming a memory array of cells on a wafer, wherein each cell includes a memory device comprising phase change material;
    completing a wafer level process of manufacturing the semiconductor device;
    densifying the phase change material after completing the wafer level process, wherein the densifying comprises subjecting the wafer to a thermal treatment; and
    a burn-in test on the memory array between the wafer level process and the thermal treatment, wherein the burn-in test comprises applying an electrical load to the memory array that is higher than the maximum load specified for the semiconductor device for its normal operation.

14. The method of claim 13, wherein the phase change material is of a composition including Ge, Sb, and Te, the atomic % of Sb in the composition is greater than 22.2 atomic %, and the crystallization temperature at which the state of the phase change material changes from amorphous to crystalline is greater than about 150° C.

15. The method of claim 14, wherein the atomic % of Sb in the composition is at least 27.7 atomic %.

16. The method of claim 14, wherein the crystallization temperature of the phase change material is at least about 165° C.

17. The method of claim 13, wherein in the thermal treatment the maximum process temperature is higher than the crystallization temperature of the phase change material and lower than the melting point of the phase change material.

* * * * *